United States Patent
Cha et al.

(10) Patent No.: US 7,616,061 B2
(45) Date of Patent: Nov. 10, 2009

(54) LOW NOISE AMPLIFIER FOR ULTRA WIDE BAND

(75) Inventors: Choong-yul Cha, Yongin-si (KR); Hoon-tae Kim, Yongin-si (KR); Sang-gug Lee, Daejeon (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 291 days.

(21) Appl. No.: 11/336,788

(22) Filed: Jan. 23, 2006

(65) Prior Publication Data

US 2006/0170502 A1    Aug. 3, 2006

(30) Foreign Application Priority Data

Feb. 1, 2005    (KR) ............... 10-2005-0009135

(51) Int. Cl.
*H03F 3/68* (2006.01)
(52) U.S. Cl. .................. 330/295; 330/126; 330/283
(58) Field of Classification Search ............ 330/283, 330/295, 124 R, 126
See application file for complete search history.

(56) References Cited

U.S. PATENT DOCUMENTS

| | | | |
|---|---|---|---|
| 6,806,777 B2 * | 10/2004 | Franca-Neto | 330/311 |
| 6,809,581 B2 * | 10/2004 | Rofougaran et al. | 327/563 |
| 7,023,272 B2 * | 4/2006 | Hung et al. | 330/126 |
| 7,081,796 B2 * | 7/2006 | Krone | 330/254 |
| 7,098,737 B2 * | 8/2006 | Fujimoto et al. | 330/283 |
| 7,187,239 B2 * | 3/2007 | Yeh | 330/311 |
| 7,203,472 B2 * | 4/2007 | Seppinen et al. | 455/226.1 |
| 7,256,646 B2 * | 8/2007 | Eid et al. | 330/260 |

\* cited by examiner

*Primary Examiner*—Khanh V Nguyen
(74) *Attorney, Agent, or Firm*—Sughrue Mion, PLLC

(57) ABSTRACT

A low noise amplifier (LNA) for ultra wide band receives and amplifies identical RF signals in different frequency bands, and includes more than one pair of narrow band LNAs coupled in parallel, and a load circuit which increases load impedance of the entire circuit of the narrow band LNAs. The LNA can not only amplify the RF signal in the UWB but also obtain the low noise and the high gain that are features of the conventional narrow band LNA.

11 Claims, 4 Drawing Sheets

LOW NOISE AMPLIFIER FOR ULTRA WIDE BAND

CROSS-REFERENCE TO RELATED APPLICATIONS

This application claims the benefit under 35 U.S.C. § 119(a) from Korean Patent Application No. 2005-9135 filed on Feb. 1, 2005 in the Korean Intellectual Property Office, the entire disclosure of which is incorporated herein by reference.

BACKGROUND OF THE INVENTION

1. Field of the Invention

Apparatuses consistent with the present invention relate to a low noise amplifier for ultra wide band. More particularly, the present invention relates to a low noise amplifier (LNA) for ultra wide band (UWB), which amplifies signals in the ultra wide band by coupling narrow band LNAs and thus obtains high gain and low noise figure (NF) which are characteristics of the narrow band LNA.

2. Description of the Related Art

With the wide use of Internet and the rapid increase of multimedia data, there is a great demand for very high speed communication networks. Among those networks, a local area network (LAN) has been introduced in the late 1980's. The transfer rate of the LAN was about 1-4 Mbps at the initial phase and has increased to 100 Mbps. As there is an increasing demand for global access to networks due to the prevalence of portable computers and personal digital assistants (PDAs), the wireless communication technology is of great concern.

To respond to those demands, an ultra wide band communication technique which enables wireless communications in high speed wide band together with existing wireless communication services is under development. To distinguish the UWB from the existing narrow band systems and the wide band systems with 3G cellular technology, the UWB is defined as a wireless transmission technology with bandwidth that occupies more than 25% or 1.5 GHz of center frequencies. Primarily, the UWB occupies the frequency band ranging from 3.1 to 10.6 GHz and covers a transmission range of 10 meters through 100 meters.

A wireless terminal used for such wireless communications, as shown in FIG. 1, includes a receiving block 10, a transmitting block 20, a controller 30, a modem 40, and a local oscillator (LO) 50.

The receiving block 10 includes a low noise amplifier (LNA) 11, a mixer 13, and a filter 15. A radio frequency (RF) signal, which is a high frequency signal received via an antenna, has a very low power level due to attenuation and noise. The LNA 11 removes the noise from the RF signal and amplifies the RF signal. The mixer 13 converts the amplified RF signal to an intermediate frequency (IF) signal. The filter 15 filters a required region from the IF signal and provides the filtered region to the modem 40.

The modem 40 converts the IF signal input from the filter 15 to a Rx baseband signal. The modem 40 also converts a Tx baseband signal to be provided to the filter 25 of the transmitting block 20 to an IF signal. The LO 50 receives a control signal and generates LO signals to be fed to the modem 40 and the filter 25.

The transmitting block 20 includes a filter 25, a mixer 23, and a power amplifier 21. The filter 25 filters a required region from the IF signal to be transmitted. The mixer 23 converts the IF signal to the RF signal. The power amplifier 21 amplifies the output so that the RF signal can be transmitted.

The sensitivity of the wireless terminal directly depends on a noise figure (NF), and substantially, noise of the receiving end is determined by the LNA 11. Thus, it is crucial to design the LNA 11 with suitable linearity and gain while the noise is minimized. The related art can design the LNA 11 to meet such requirements in the narrow band mostly used.

With the active development and research on UWB, various LNA designs have been made to implement the LNA available in the UWB.

U.S. Pat. No. 6,735,421 (hereafter, referred to as a prior art 1) titled, "Receiver Including Low Noise Amplifier And Frequency Down-Converter For A Wireless Telecommunication System," describes a narrow band LNA including a field effect transistor (FET), a resistor R3 and a capacitor C1 for the negative feedback connected in parallel between a gate terminal and a drain terminal of the FET as shown in FIG. 2. The resistor R3 and the capacitor C1 reduce the gain in the low frequency and prevent the amplifier from getting high gain in the low frequency. In other words, the RC feedback design increases the output with respect to the input of the LNA and expands the bandwidth rather than reducing the gain. As a result, the prior art 1 can realize the LNA for the wide band but produces high NF and low gain.

U.S. Pat. No. 6,806,777 (hereafter, referred to as a prior art 2 titled "Ultra Wide Band Low Noise Amplifier And Method" discloses a wide band LNA using a common-gate input as shown in FIG. 3. The LNA of the prior art 2 includes a cascode 102 with a load tracking (LT) network 104, and a common-gate part 106. The common-gate part 106 is in a common-gate amplifier arrangement since an RF signal is input to its source and its gate is AC grounded. Hence, the wide band amplifier can be designed since an RFin terminal can match the wide band impedance. However, the LNA of the prior art 2 cannot obtain high gain due to the impedance but produces high NF as the RF signal is input to the source.

Therefore, what is needed is a LNA for the UWB with the high gain and low noise advantages of the narrow band LNA.

SUMMARY OF THE INVENTION

Embodiments of the present invention have been provided to address the above-mentioned and other problems and disadvantages occurring in the conventional arrangement, and aspects of these embodiments provide a low noise amplifier (LNA) for ultra wide band (UWB) with high gain and low noise by use of narrow band LNAs.

These aspects are achieved by providing a low noise amplifier (LNA) for ultra wide band (UWB) including more than one pair of narrow band LNAs which are coupled in parallel, and receive and amplify identical RF signals in different frequency bands; and a load circuit which increases the load impedance of the entire circuit of the narrow band LNAs.

The narrow band LNAs each may include an amplifying element and a pair of inductors which are connected to a source and a gate, respectively, of the amplifying element.

The amplifying element of each narrow band LNA may be connected to a common-gate amplifying element forming a cascode amplifier.

The load circuit may be positioned between the common-gate amplifying elements, and may include a load resistor, an inductor, and a capacitor that are connected in parallel.

The low noise amplifier may further include a buffer amplifying element which may include the load circuit between a gate and a drain, to minimize the influence of external impedance.

BRIEF DESCRIPTION OF THE DRAWINGS

These and other aspects and advantages of the invention will become apparent and more readily appreciated from the following description of exemplary embodiments, taken in conjunction with the accompanying drawing figures of which.

DETAILED DESCRIPTION OF THE EMBODIMENTS

Figure 1:
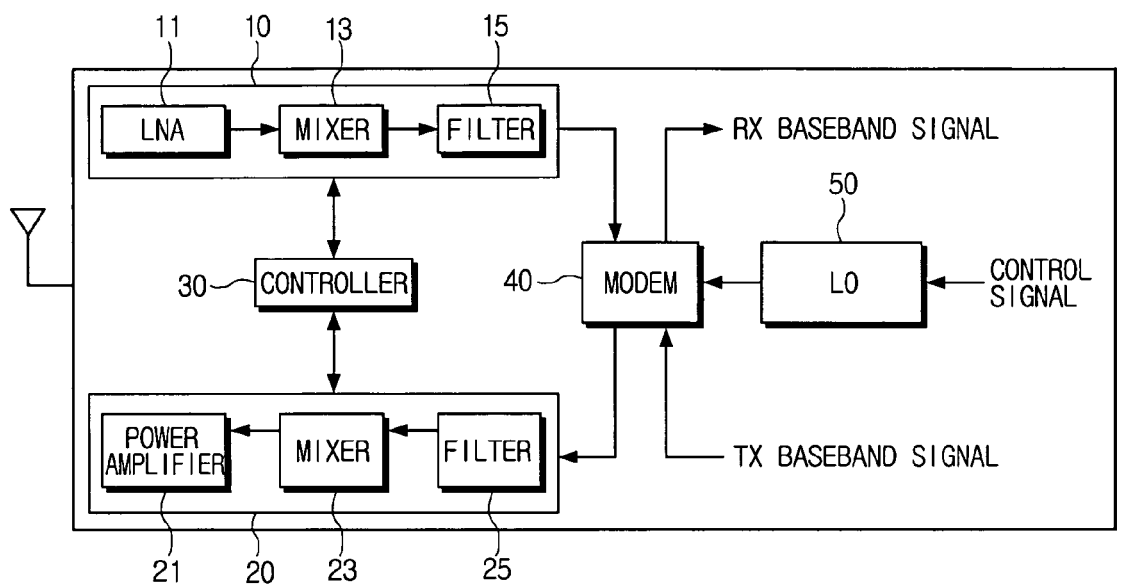
FIG. 1 is a schematic block diagram of a conventional wireless terminal.
Figure 2:
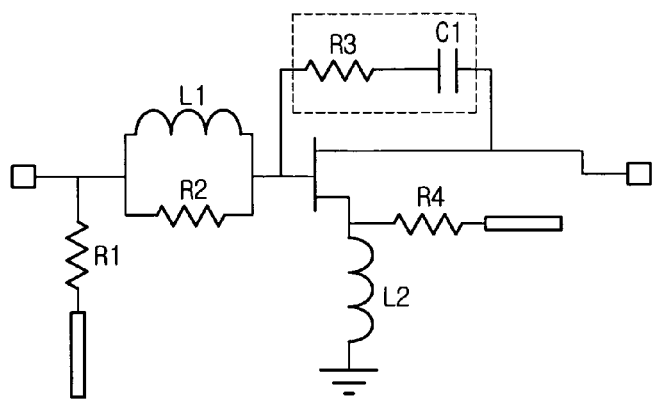
FIG. 2 is a circuit diagram of a conventional wide band LNA used for a wireless communication system.
Figure 3:
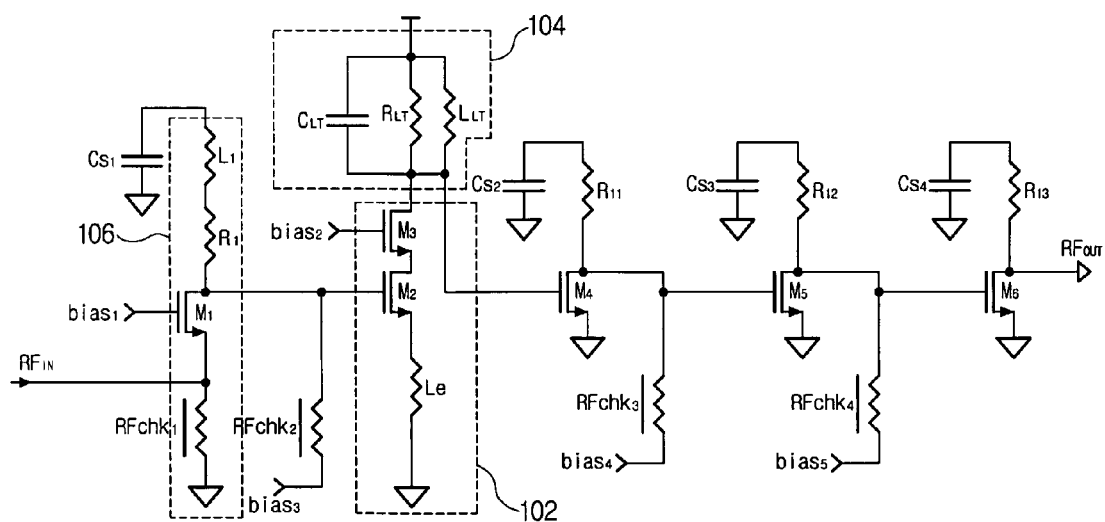
FIG. 3 is a circuit diagram of a conventional wide band LNA using a common-gate input.

Certain exemplary embodiments of the present invention will now be described in greater detail with reference to the accompanying drawings.

In the following description, same drawing reference numerals are used for the same elements even in different drawings. The matters defined in the description, such as detailed construction and element descriptions, are provided to assist in a comprehensive understanding of the invention. Also, well-known functions or constructions are not described in detail since they would obscure the invention in unnecessary detail.

Figure 4:
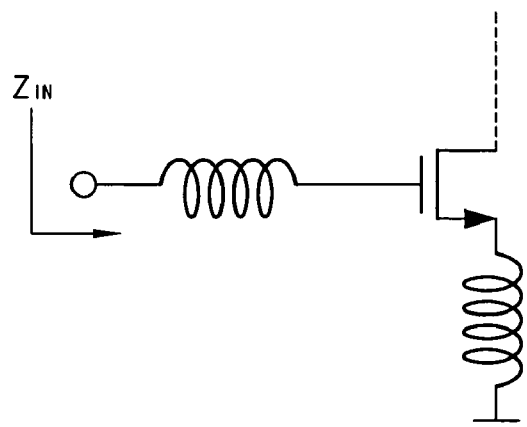
FIG. 4 is a schematic circuit diagram of a conventional narrow band LNA.

A general narrow band low noise amplifier (LNA), as shown in FIG. 4, employs inductors at a source and a gate of an amplifying element and thus generates an impedance input to the LNA up to 50 Ω.

A LNA for ultra wide band (UWB) according to an embodiment of the present invention is designed by coupling narrow band LNAs in parallel.

Figure 5:
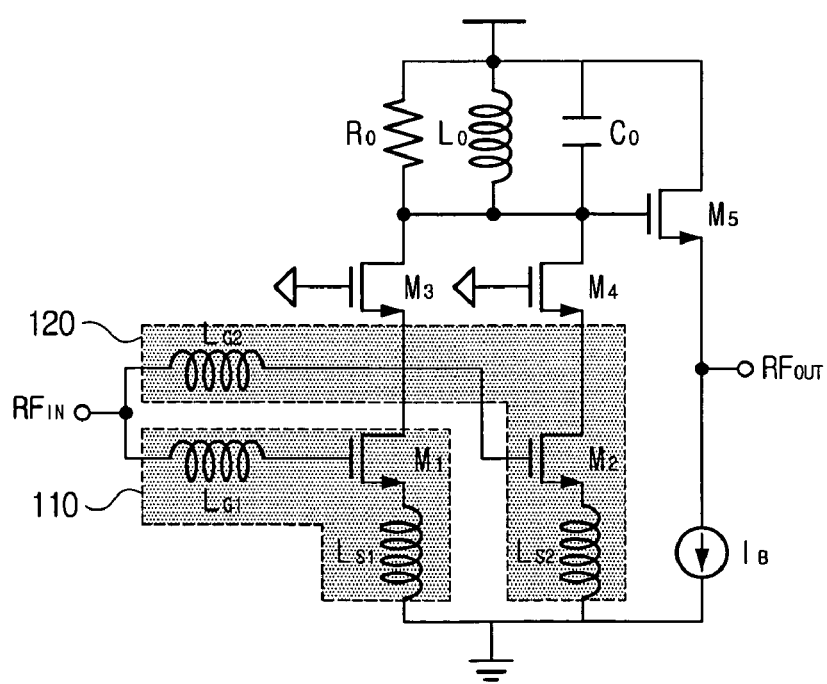
FIG. 5 is a schematic circuit diagram of a LNA for UWB according to an embodiment of the present invention.

FIG. 5 is a schematic circuit diagram of the LNA for the UWB according to an embodiment of the present invention. As shown in FIG. 5, the LNA includes first and second amplification parts 110 and 120 which are narrow band amplification parts arranged in parallel.

The first amplification part 110 may include an amplifying element M1, and a pair of inductors $L_{G1}$ and $L_{S1}$ connected to a source and a gate of the amplifying element M1. The second amplification part 120 may include an amplifying element M2, and a pair of inductors $L_{G2}$ and $L_{S2}$ connected to a source and a gate of the amplifying element M2.

The amplifying elements M1 and M2 of the first and second amplification parts 110 and 120 amplify a radio frequency (RF) signal input via an antenna. As the amplifying elements M1 and M2 are coupled in parallel, the input RF signal is divided to them and amplified in the respective first and second amplification parts 110 and 120. The amplifying element M1 may be designed in a size different from the amplifying element M2. As a result, the frequencies of the amplified signals are different from each other even when the identical RF signals are input.

Generally, the impedance of an RF signal input to a narrow band LNA is 50 Ω. For the sake of impedance matching, the inductances of the inductors $L_{G1}$ and $L_{S1}$ connected to the amplifying element M1 may be set such that the first amplification part 110 has an input impedance of 50 Ω at or near its center frequency, and the inductances of the inductors $L_{G2}$ and $L_{S2}$ connected to the amplifying element M2 may be set such that the second amplification part 120 has an input impedance of 50 Ω at or near its center frequency. In other words, the inductances of the respective inductors may be set to be suitable to the different sizes of the amplifying elements M1 and M2 so that at or near the frequencies of the RF signal amplified at the amplifying elements M1 and M2 having the different sizes, the RF signal impedance matches or approaches the input impedances of the first amplification part 110 and the second amplification part 120.

Amplifying elements M3 and M4 connected to the drains of the amplifying elements M1 and M2 of the first and second amplification parts 110 and 120 respectively, may be common-gate amplifying elements coupled in parallel and having the same input. The amplifying elements M3 and M4 may be realized by NMOS transistors. The amplifying elements M1 and M3 form a cascode amplifier, and the amplifying elements M2 and M4 form a cascode amplifier. In practice, the cascode amplifier can improve the amplification characteristics. Thus, the design of the amplifying elements M3 and M4 can increase the gain of the first and second amplification parts 110 and 120, expand the bandwidth, and reduce the noise.

A load circuit is designed between a gate and a drain of a buffer amplifying element M5, to improve the gain by increasing the impedance of the entire circuit. The load circuit may include a resistor Ro, an inductor Lo, and a capacitor Co that are connected in parallel. In the embodiment of the present invention, the LNA may employ only one load circuit because the resistor Ro, the inductor Lo, and the capacitor Co share the output of the first and second amplification parts 110 and 120 by means of the common-gate amplifying elements M3 and M4.

The buffer amplifying element M5 connected to the load circuit has high input impedance and low output impedance, and serves to forward the voltage input to the gate to the source. As the buffer amplifying element M5 converts the voltage, the impedance at the load circuit can minimize effects on the entire UWB LNA by the characteristic change due to the connection of an external circuit, and thus the deterioration of the characteristic of the UWB LNA can be prevented.

$I_B$ which is an ideal current source for supplying a constant power regardless of the voltage, is connected to the buffer amplifying element M5.

As designed above, how the UWB LNA amplifies the RF signal is now explained.

When the RF signal having the center frequency f in the wide band is input to RFin of the UWB LNA, the RF signal is divided and input to the first and second amplification parts 110 and 120 respectively. The input RF signals are amplified while passing through the amplifying elements M1 and M2 having the different sizes. The first and second amplification parts 110 and 120 amplify center frequency bands $f_1$ and $f_2$ adjacent to the input center frequency f. The amplified RF signals in the center frequency bands $f_1$ and $f_2$ pass through the load circuit where the frequency bands are combined and the voltage is amplified. Next, the RF signal is buffered at the buffer amplifying element M5 and output to RFout.

Figure 6:
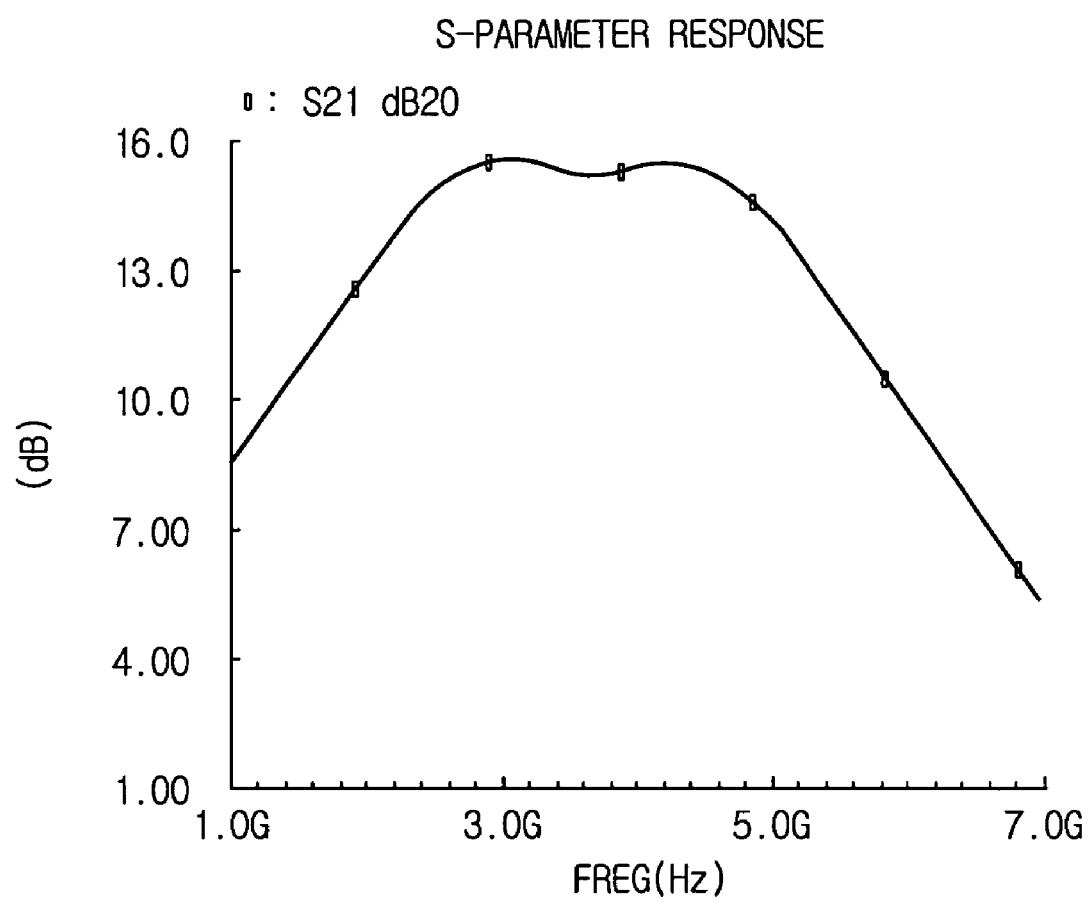
FIG. 6 is a frequency response graph of an RF signal amplified by the LNA of FIG. 5.

The RF signal is amplified in the center frequency bands $f_1$ and $f_2$ at the first and second amplification parts 110 and 120 as shown in FIG. 6. Hence, the wide band LNA can obtain the bandwidth more than two times as wide as the conventional narrow band LNA.

As set forth above, in the UWB LNA, the pair of the narrow LNAs is coupled in parallel and the amplifying elements M1 and M2 of the narrow band LNAs are designed in different sizes. As a result, the identical RF signals can be amplified in the different frequency bands. The simple design of the UWB LNA which is achieved by coupling the narrow band LNAs can expand and amplify the frequency band of the RF signal. Therefore, the UWB LNA can obtain both the low noise and the high gain advantages of the conventional narrow band LNA.

It has been illustrated that the first and second amplification parts 110 and 120, which are the narrow band amplifiers, are provided in a pair. Note that more than two amplification parts can be designed. When a plurality of narrow band amplifiers are employed, the frequency bands of the amplified signal can be further expanded.

Although the first and second amplification parts 110 and 120 each include the amplifying element and the pair of inductors, a narrow band amplifier having other circuit elements, for example, amplifying elements and resistors may also be used.

Although NMOS transistors are adapted as the amplifying elements M1 and M2 as shown in FIG. 5, other amplifying elements, for example, high electron mobility transistors (HEMT) or bipolar transistors may be employed.

While the present invention has been particularly shown and described with reference to exemplary embodiments thereof, it will be understood by those skilled in the art that various changes in form and details may be made therein without departing from the spirit and scope of the invention as defined by the appended claims.

What is claimed is:

1. A low noise amplifier (LNA) for ultra wide band (UWB), comprising:
   more than one pair of LNAs which is coupled in parallel, and receives and amplifies identical RF signals in different frequency bands; and
   a load circuit which increases load impedance of an entire circuit of the LNAs, wherein the LNAs are narrow band LNAs,
   wherein each LNA comprises an amplifying element fabricated in a different size designed to amplify a different frequency band.

2. The low noise amplifier of claim 1, wherein the narrow band LNAs each include an amplifying element and a pair of inductors which is connected to a source and a gate of the amplifying element respectively.

3. The low noise amplifier of claim 2, wherein the amplifying element is one of an NMOS transistor, a high electron mobility transistor (HEMT), and a bipolar transistor.

4. The low noise amplifier of claim 2, wherein the amplifying element of each narrow band LNA is connected to a common-gate amplifying element which forms a cascode amplifier together with the amplifying element, and the common-gate amplifying element has a common gate input.

5. The low noise amplifier of claim 4, wherein the load circuit is positioned between the common-gate amplifying elements, and includes a load resistor, an inductor, and a capacitor that are connected in parallel.

6. The low noise amplifier of claim 5, further comprising: a buffer amplifying element which includes the load circuit located between a gate and a drain of the buffer amplifying element.

7. A low noise amplifier (LNA) for ultra wide band (UWB), comprising:
   a plurality of LNAs coupled in parallel, wherein each LNA receives an identical RF signal and amplifies the RF signal in different frequency bands; and
   a load circuit which increases load impedance of the entire circuit of the LNAs, wherein the LNAs are narrow band LNAs,
   wherein each LNA comprises an amplifying element fabricated in a different size designed to amplify a different frequency band.

8. The low noise amplifier of claim 7, wherein each narrow band LNA comprises:
   an inductor connected to a source of the amplifying element; and
   an inductor connected to a gate of the amplifying element.

9. The low noise amplifier of claim 8, wherein the amplifying element is one of an NMOS transistor, a high electron mobility transistor (HEMT), and a bipolar transistor.

10. The low noise amplifier of claim 8, wherein the inductor connected to the source of the amplifying element and the inductor connected to the gate of the amplifying element are sized to provide a 50 Ω input impedance for each narrow band LNA.

11. A low noise amplifier (LNA) for ultra wide band (UWB), comprising:
    a plurality of LNAs coupled in parallel, wherein each LNA receives an identical RF signal and amplifies the RF signal in different frequency bands; and
    a load circuit which increases load impedance of the entire circuit of the LNAs, wherein the LNAs are narrow band LNAs,
    wherein each narrow band LNA comprises:
       an amplifying element;
       an inductor connected to a source of the amplifying element; and
       an inductor connected to a gate of the amplifying element,
       wherein each amplifying element is fabricated in a different size designed to amplify a different frequency band.

* * * * *